(12) United States Patent
Onishi et al.

(10) Patent No.: US 6,225,033 B1
(45) Date of Patent: May 1, 2001

(54) METHOD OF FORMING A RESIST PATTERN

(75) Inventors: Yasunobu Onishi; Kentaro Matsunaga; Shoji Mimotogi; Katsuya Okumura, all of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/413,543

(22) Filed: Oct. 6, 1999

(30) Foreign Application Priority Data

Oct. 7, 1998 (JP) .................................................. 10-285215

(51) Int. Cl.$^7$ ....................................................... G03F 7/30
(52) U.S. Cl. ............................................. 430/322; 430/329
(58) Field of Search ..................................... 430/322, 329

(56) References Cited

U.S. PATENT DOCUMENTS

| 4,215,192 | * | 7/1980 | Buckley | 430/270.1 |
| 4,342,917 | * | 8/1982 | Buckley | 430/967 |
| 5,244,759 | * | 9/1993 | Pierrat | 430/316 |

FOREIGN PATENT DOCUMENTS

| 2-184373 | 7/1990 | (JP) . |
| 4-314002 | 11/1992 | (JP) . |
| 7-21640 | 3/1995 | (JP) . |

* cited by examiner

*Primary Examiner*—Hoa Van Le
(74) *Attorney, Agent, or Firm*—Finnegan, Henderson, Farabow, Garrett & Dunner, L.L.P.

(57) ABSTRACT

An anti-reflection film has been formed on an $SiO_2$ film on a silicon substrate formed on a silicon wafer. A chemical amplification positive resist is formed on the anti-reflection film. The resist is exposed to light. Vapor of strong alkali is applied to a surface of the chemical amplification positive resist. The entire resist is developed with a developing solution, thereby forming a resist pattern.

14 Claims, 4 Drawing Sheets

METHOD OF FORMING A RESIST PATTERN

BACKGROUND OF THE INVENTION

The present invention relates to a method of forming a resist pattern in the lithography process performed in manufacturing a semiconductor device or an exposure mask.

To manufacture semiconductor devices of high integration density, fine resist patterns must be formed. To minimize the manufacturing cost of the devices, it is desired that the exposure apparatuses that have been used for the past thirty years should form resist patterns as fine as they can. Further, resist patterns should be formed to satisfy two requirements. First, they must have a size almost equal to the design size even if the focusing or the amount of light applied (hereinafter called "exposure dose") differs from the design value. Second, they must have slits each having a rectangular cross section.

Figure 1:
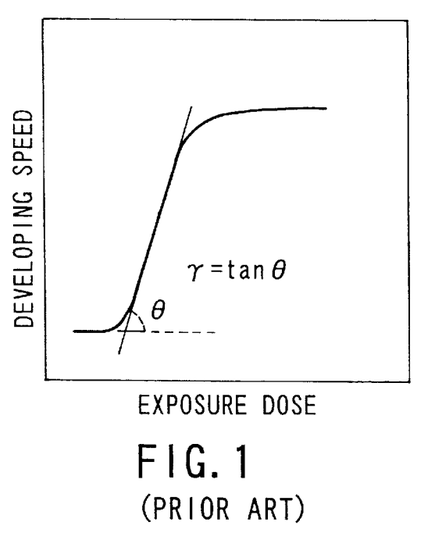
FIG. 1 is a graph showing the dissolving characteristic γ of a resist film, which is determined from the exposure dose and the developing speed.

FIG. 1 shows the relation between the exposure dose and the developing speed of a resist film. The exposure dose is plotted on the abscissa, and the developing speed on the ordinate. As seen from FIG. 1, the developing speed is proportional to the exposure dose, once after it reaches a certain value. That is, the speed slopes at an angle θ with respect to the exposure dose. The dissolving characteristic γ of the resist film is given as: γ=tan θ.

Figure 2:
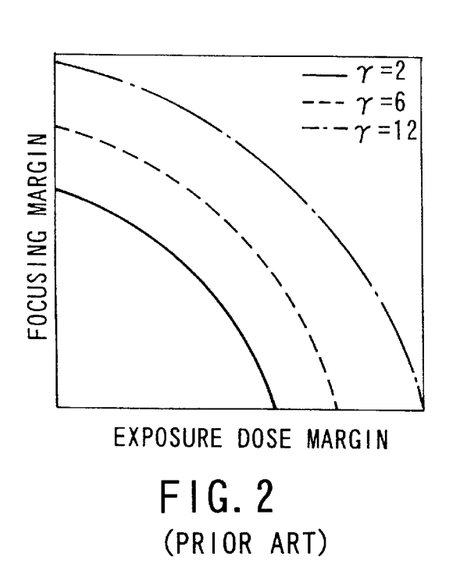
FIG. 2 is a graph representing the relation which the exposure dose margin and focusing margin for a resist film have with respect to the dissolving characteristic γ.

FIG. 2 represents the relation the exposure dose margin and the focusing margin have with respect to the dissolving characteristic γ. The exposure dose margin is plotted on the abscissa, whereas the focusing margin is plotted on the ordinate. When γ=2, the exposure dose margin and the focusing margin have the relation indicated by the solid line. When γ=6, they have the relation indicated by the broken line. When γ=12, they have the relation indicated by the dot-dashed line. As can be understood from FIG. 2, both the exposure dose margin and the focusing margin will increase if the value γ is increased. Hence, it suffices to increase the value γ in order to form a resist pattern that has a size almost equal to the design size, when the exposure dose or the focusing differs from the design value.

A resist film must be processed into a resist pattern that has slits each having a rectangular cross section. To this end, the resist film must be more insoluble with the developing solution toward its upper surface. Various methods of providing such a resist film are known. These methods are classified into two types. The first type is to use a special material to form such a resist film. The second type is to apply a developing solution to a film of naphtoquinone-novolac resist (generally used as g-line resist or i-line resist), thereby forming an insoluble top layer. The method of the second type, in which an insoluble top layer is formed, is indispensable to form a resist pattern that has slits each having a rectangular cross section. Any resist film made by this method is, however, found disadvantageous in that the exposure dose margin and the focusing margin decrease toward the lower surface of the resist film. This is inevitably because the developing speed increases toward the lower surface, too.

Figure 3:
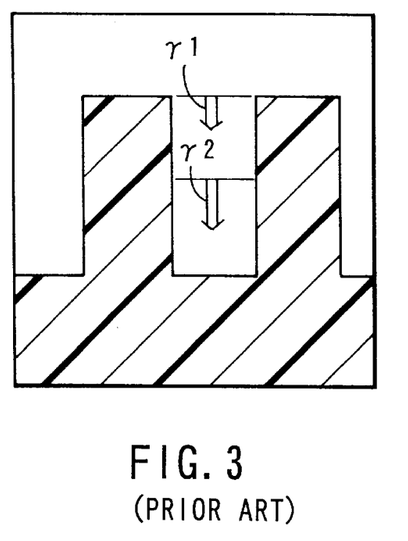
FIG. 3 is a schematic representation of the dissolving rate $r_1$ in the upper surface of a resist film and the dissolving rate $r_2$ in the entire resist film.
Figure 4:
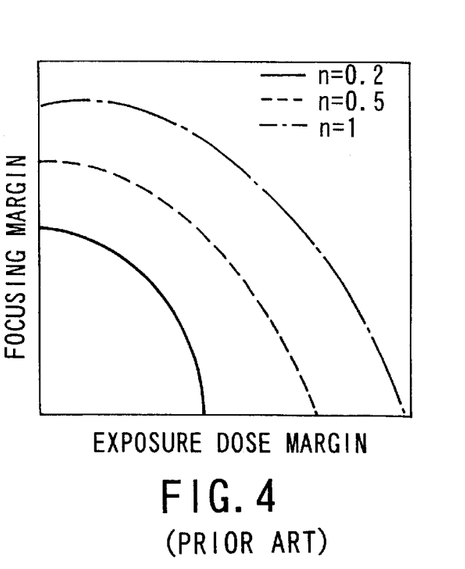
FIG. 4 is a graph illustrating how the ratio n of the dissolving rate $r_1$ to the dissolving rate $r_2$ influences the relation between the exposure dose margin and the focusing margin.

FIG. 3 is a schematic representation of the dissolving rate $r_1$ in the upper surface of a resist film and the dissolving rate $r_2$ in the entire resist film. Generally, $r_1<r_2$ as is shown in FIG. 3. The ratio n of $r_1$ to $r_2$, i.e., $r_1/r_2$, influences the relation between the exposure dose margin and the focusing margin, as is illustrated in FIG. 4. In FIG. 4, the exposure dose margin is plotted on the abscissa, and the focusing margin on the ordinate. When n=0.2, the exposure dose margin and the focusing margin have the relation indicated by the solid line. When n=0.5, they have the relation indicated by the broken line. When n=1, they have the relation indicated by the dot-dashed line. As FIG. 4 shows, the greater the ratio n, the greater both margins. Hence, there are two requirements that should be satisfied to make slits having a rectangular cross section and to maintain both the exposure dose margin and the focusing margin at sufficient values. First, the resist should be improved in properties. Second, the rate of dissolving the resist film should vary with as the developing process proceeds.

Methods of varying the dissolving rate with time are disclosed in Jpn. Pat. Appln. KOKAI Publications Nos. 2-184373 and 4-314002. In these methods, a developing solution of high concentration is first applied to a resist film and a developing solution of low concentration is then applied to the resist film. However, it takes time to replace the unit for applying the high-concentration solution with the unit for applying the low-concentration solution. This makes it impossible to form slits having a rectangular cross section and to maintain both margins at sufficient values.

The dissolving rate may be varied with time by another method to develop a resist film having an insoluble top layer. In this method, a first developing solution of high dissolving power is first applied to a resist film and a second developing solution of low dissolving power is then applied to the resist film. That is, the method develops the resist film in two steps. In the first step, the resist film is developed with the first solution that can readily dissolve the insoluble top layer. In the second step, the resist film is developed with the second solution which differs in composition from the first solution and which has a smaller dissolving power than the first solution.

A method of this kind is disclosed in Jpn. Pat. Appln. KOKOKU Publication No. 7-21640. In this method, the first unit for applying the high-concentration solution cannot be quickly replaced by the second unit for applying the low-concentration solution, either. In the case of a resist film having a high γ value, such as a chemical amplification resist film, the developing will proceed to the lower surface of the film within one to two seconds. The first unit must therefore be replaced with the second unit within a time shorter than one second to maintain the exposure dose margin and the focusing margin at sufficient values. It is extremely difficult to replace the first unit with the second so fast, though it may seem easy to do so. As described above, a pattern should be formed so as to have a size almost the same as the design size even if the focusing or the exposure dose differs from the design value and to have slits each having a rectangular cross section. In a conventional method of forming a resist pattern, the resist film is first developed with a high-concentration solution and then with a low-concentration solution. In another conventional method, the resist film is first developed with a solution having high dissolving power and then with a solution having low dissolving power. With either conventional method it is impossible to replace one solution-applying unit with the other solution-applying unit within as short a time as desired.

BRIEF SUMMARY OF THE INVENTION

The object of the present invention is to provide a method of forming a resist pattern, in which slits having a rectangular cross section can be formed in a resist film and the exposure dose and the focusing margin can be sufficiently large.

According to one aspect of the invention, there is provided a method of forming a resist pattern, which comprises the steps of: exposing a resist formed on a substrate, to light; applying a strong alkali substance to a surface of the resist, which has been exposed to light; and developing the entire resist by applying a developing solution that is less alkaline than the strong alkali substance.

According to another aspect of this invention, there is provided a method of forming a resist pattern, which comprises the steps of: forming an $SiO_2$ film on a silicon substrate; forming an anti-reflection film on the $SiO_2$ film; forming a chemical amplification positive resist on the anti-reflection film; exposing the chemical amplification positive resist to vapor containing a strong alkali substance, thereby applying the strong alkali substance to a surface of the chemical amplification positive resist; and developing the entire resist with a developing solution that is less alkaline than the strong alkali substance.

Preferably, the step of applying the strong alkali substance to the surface of the resist is to expose the resist to vapor of strong alkali. It is desired that the resist be a chemical amplification positive resist and that the developing solution is one that does not dissolve those parts of the surface of the resist, which have not been exposed to light.

In the present invention, the resist is developed in two steps, strong developing step and weak developing steps. In the strong developing step, strong alkali is applied to the surface of the resist. Therefore, the unit for performing the strong development can reliably be replaced by the unit for applying the weak development within a short time. Hence, the method can form a resist pattern which has a large exposure dose margin and a large focusing margin and which can yet have slits having a rectangular cross section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the invention will be described, with reference to the accompanying drawings.
(First Embodiment)

Figure 5A:
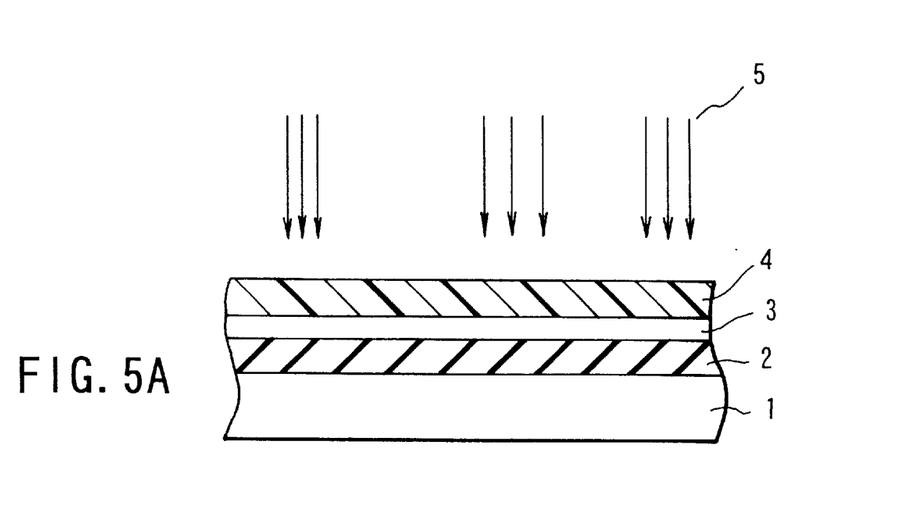
FIGS. 5A to 5C are cross-sectional views for explaining a method of forming a resist pattern, which is the first embodiment of the invention.
Figure 5B:
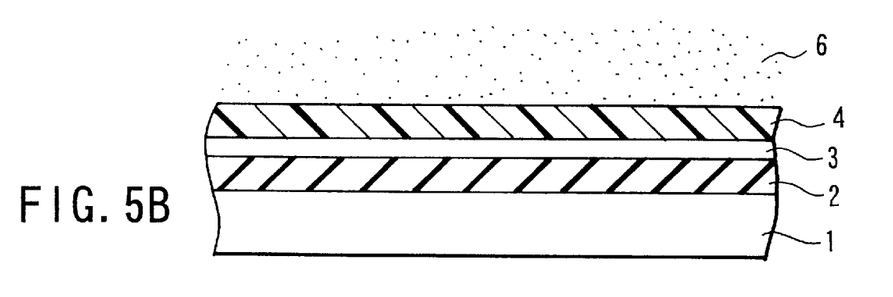
Figure 5C:
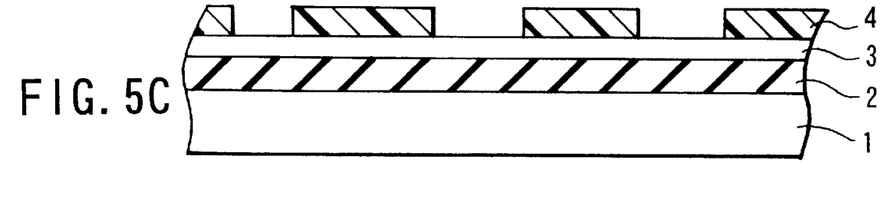

A method of forming a resist pattern, which is the first embodiment of the invention, will be described with reference to FIGS. 5A to 5C and FIGS. 6 to 11. FIGS. 5A to 5C are cross-sectional views, explaining the method.

First, an $SiO_2$ film 2 was formed 500 nm thick on a silicon wafer 1, as is shown in FIG. 5A. Thereafter, an anti-reflection film 3 of organic material DUV30 (manufactured by Brewer Science, Inc.) was spin-coated on the $SiO_2$ film 2 to a thickness of 55 nm by means of a coating-developing apparatus ACT8 (manufactured by Tokyo Electron Limited). The silicon wafer 1 coated with the anti-reflection film 3 was baked at 190° C. for 90 seconds. Then, a chemical amplification positive resist 4 made of KRF S150G (manufactured by JSR Co., Ltd.) was formed on the anti-reflection film 3 to a thickness of 390 nm by means of spin coating. The silicon wafer 1, now having the resist 4, was backed at 100° C. for 60 seconds.

Next, light was applied to the resist 4 through a photomask of a desired pattern by means of an exposure apparatus NSR-S202A (manufactured by Nikon Corporation). A latent pattern was thereby printed on the resist 4. The resist 4 was exposed to light at NA of 0.6 and α of 0.75, and the photomask was a chromium mask. The silicon wafer 1 having the chemical amplification resist 4 thus exposed to light was baked at 100° C. for 90 seconds. As a result, the structure shown in FIG. 5A was obtained.

Then, the silicon wafer 1 was treated with a 25% aqueous solution of TMAH (tetramethylammonium hydroxide) at 60° C. for one minute, by using the adhesion unit incorporated in the coating-developing apparatus ACT8. The TMAH aqueous solution worked as a strong alkali to the chemical amplification resist 4. More specifically, the resist 4 was exposed to the vapor 6 of the TMAH aqueous solution. Strong development was thereby performed on only the surface of the resist 4, as is shown in FIG. 5B. The TMAH was therefore applied to the surface of the chemical amplification resist 4. TMAH contacts the surface of the resist 4, causing hydrogen bonding or ionic bonding.

When the silicon wafer 1 was baked after the chemical amplification resist 4 had been exposed to light, the dissolution inhibiting group in the light-exposed parts of the resist 4 partly decomposed into carboxylic acid or phenol. The carboxylic acid or phenol undergoes acid-alkali reaction with the strong alkali, causing ionic bonding. Nonetheless, the resist 4 was not dissolved because there existed no solution (e.g., water) capable of dissolving the resultant ions. The dissolution inhibiting group in any part of the resist 4 that had not exposed to light was bonded to the strong alkali, achieving hydrogen bonding, because the group did not decompose at all.

TMAH was deposited in a small amount on the TMAH layer which had been applied to the surface of the resist 4 and at which the hydrogen bonding or ionic bonding had achieved. At the time of the strong development, a reaction known as adsorption took place on the surface of the chemical amplification resist 4. Hence, the resist 4 was not dissolved, though it underwent a chemical reaction with TMAH.

Thereafter, aqueous solution of 0.15N tetramethylammonium hydroxide (TMAH) was dripped onto the chemical amplification resist 4, thereby developing the resist 4 for 60 seconds. The resist 4 was thereby immersed in a solution that was a weaker developing agent than the vapor 6 of strong alkali. Weak development was accomplished at the resist 4. As a result, an L&S (Line and Space) pattern having a line width of 0.15 $\mu$m was formed on the anti-reflection film 3, as is illustrated in FIG. 5C.

The L&S pattern thus formed was examined under a scanning electron microscope (SEM) for the line width of the pattern. To be more specific, the widths of the lines were measured, for those parts of the pattern where the exposure dose and the focusing had changed.

Two L&S patterns were prepared by two conventional methods, respectively, for comparison with the 0.15 $\mu$m L&S pattern formed by the method explained with reference to FIGS. 5A to 5C. The first conventional method is identical to the method of FIGS. 5A to 5C, except that the resist was developed for 60 seconds with 0.15N TMAH aqueous solution only. The second conventional method is identical to the method of FIGS. 5A to 5C, except that the resist was developed for five seconds with 0.27N TMAH aqueous solution only. No other developing solution was applied in either conventional method.

Figure 6:
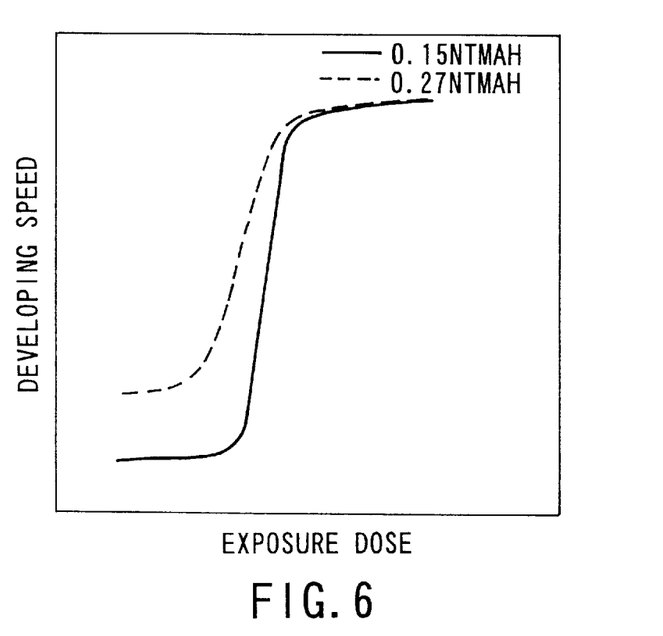
FIG. 6 is a graph showing the relations the developing speed and the exposure dose had in two conventional methods, for comparison with the results attained in the method shown in FIGS. 5A to 5C.

FIG. 6 shows the relation between the developing speed and the exposure dose, which was observed in the first conventional method, and also the relation between the developing speed and the exposure dose, which was observed in the second conventional method. In FIG. 6, the exposure dose is plotted on the abscissa, and the developing speed on the ordinate. The solid line curve represents the relation observed when 0.15N TMAH aqueous solution was applied to the resist. The broken line curve indicates the relation observed when 0.27N TMAH aqueous solution was applied to the resist. Obviously, the 0.27N TMAH aqueous solution developed the resist more slowly than the 0.27N TMAH aqueous solution, particularly when the exposure dose was relatively small. As seen from FIG. 6, the developing speed was proportional to the exposure dose once after the exposure dose exceeded a certain value, and sloped at an angle $\theta$ with respect to the exposure dose. The dissolving characteristic $\gamma$ of the resist is therefore given as: $\gamma = \tan \theta$. The $\gamma$ value was greater in the first conventional method using the 0.15N TMAH aqueous solution than in the second method using the 0.27N TMAH aqueous solution.

Figure 7:
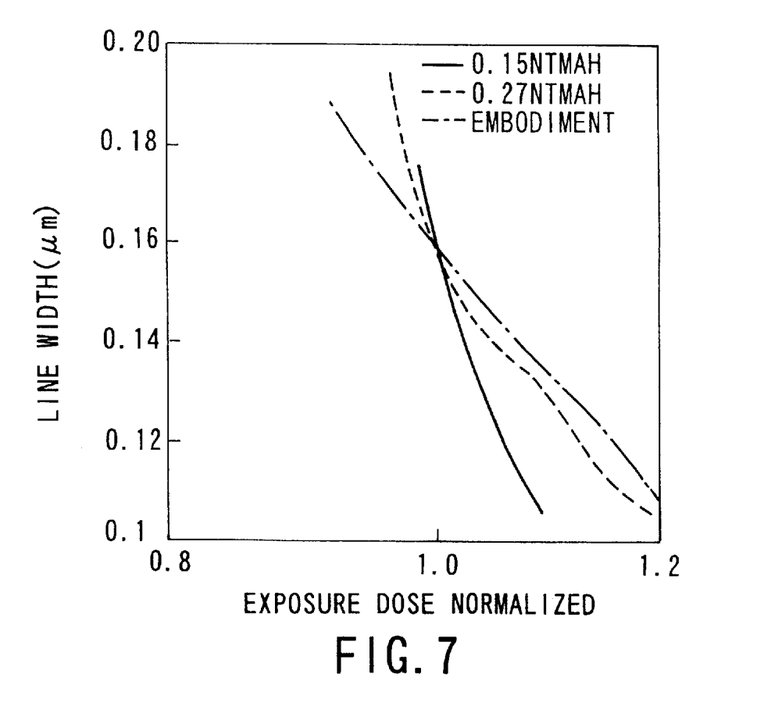
FIG. 7 is a graph illustrating the various relations the line width of resist pattern and the exposure dose had in the method of FIGS. 5A to 5C and in the conventional methods.

FIG. 7 is a graph illustrating various relations between the line width of the resist pattern and the exposure dose, which were observed in the method of FIGS. 5A to 5C and in the first and second conventional methods. The exposure dose normalized is plotted on the abscissa, while the line width of the resist pattern is plotted on the ordinate. The solid line curve shows the relation observed in the first conventional method in which 0.15N TMAH aqueous solution was applied. The broken line curve indicates the relation observed in the second conventional method in which 0.27N TMAH aqueous solution was applied. The dot-dashed line curve represents the relation observed in the method of FIGS. 5A to 5C.

The slopes of the curves shown in FIG. 7 represent the exposure dose margins obtained in the first conventional method, the second conventional method, and the method of FIGS. 5A to 5C, respectively. Generally, if the absolute slope is large, the line with of the resist pattern greatly changes with the exposure dose, even when the change in exposure dose is small. Namely, the larger the absolute slope, the smaller the exposure dose margin. Conversely, if the absolute slope is small, the line with of the resist pattern changes a little with the exposure dose, even when the change in exposure dose is rather large. That is, the smaller the absolute slope, the greater the exposure dose margin. Hence, in the first conventional method wherein 0.15N TMAH aqueous solution was used, the line width changes greatly and the exposure dose margin obtained is inevitably small. As seen from the broken line curve and the dot-dashed line curve, a larger exposure dose margin can be provided in the method of FIGS. 5A to 5C than in the second conventional method wherein 0.27N TMAH aqueous solution was used.

Figure 8:
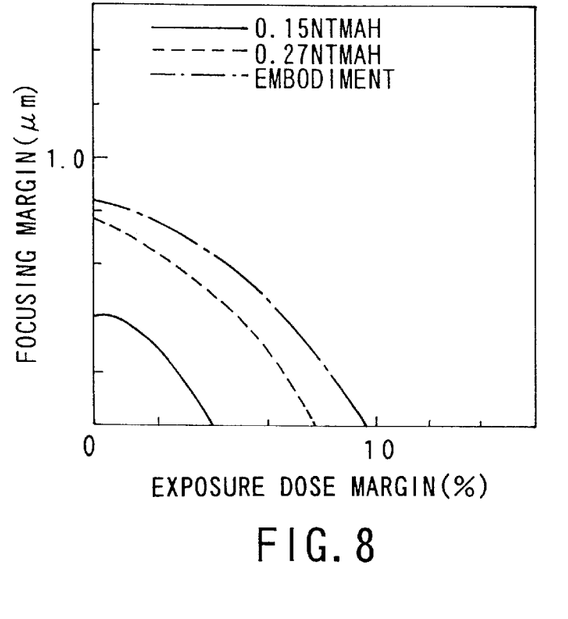
FIG. 8 is a graph depicting the various relations the exposure dose margin and the focusing margin had in the method shown in FIGS. 5A to 5C and the conventional methods.

FIG. 8 depicts the relations the exposure dose margin and the focusing margin had in the method shown in FIGS. 5A to 5C, the first conventional method and the second conventional method, respectively. In FIG. 8, the exposure dose margin is plotted on the abscissa, and the focusing margin on the ordinate. The solid line curve shows the relation observed in the first conventional method. The broken line curve indicates the relation observed in the second conventional method. The dot-dashed line curve represents the relation observed in the method of FIGS. 5A to 5C. As can be understood from FIG. 8, the exposure dose margin and the focusing margin were small in the first conventional method wherein 0.15N TMAH aqueous solution was used. Both the exposure dose margin and the focusing margin were larger in the method of FIGS. 5A to 5C than in the second conventional method wherein 0.27N TMAH aqueous solution was used.

Figure 9:
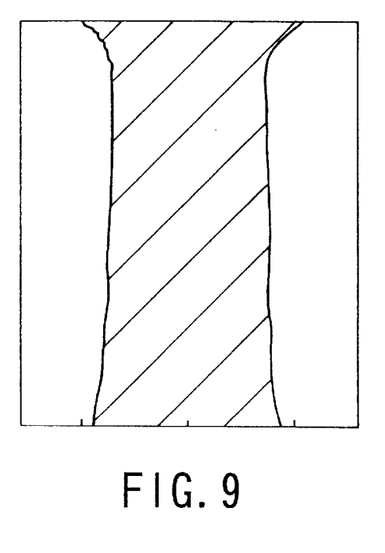
FIG. 9 is a cross-sectional view showing a part of the resist pattern formed by the first conventional method.
Figure 10:
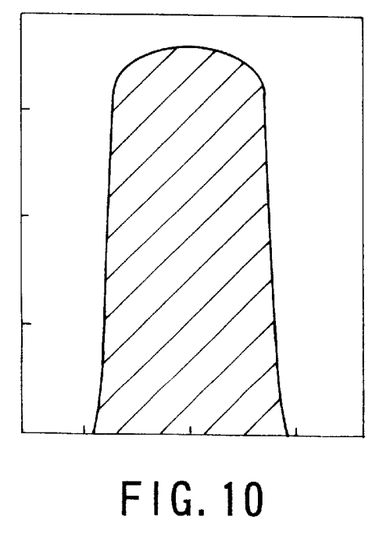
FIG. 10 is a cross-sectional view of a part of the resist pattern formed by the second conventional method.
Figure 11:
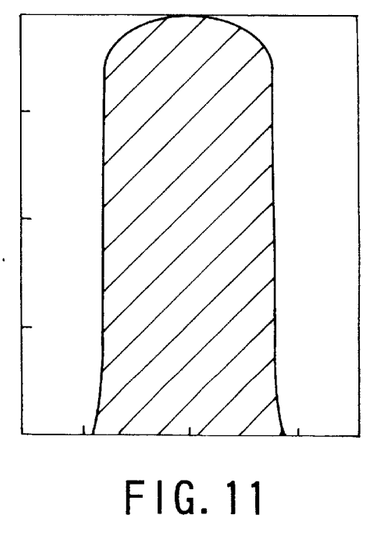
FIG. 11 is a cross-sectional view illustrating a part of the resist pattern formed by the method of FIGS. 5A to 5C.

FIGS. 9, 10 and 11 show the cross sections of three resist patterns formed by the three methods, respectively. In FIGS. 9 to 11, the shaded part indicates a resist left on the anti-reflection film.

More correctly, FIG. 9 is a cross-sectional view of the resist pattern made by the first conventional method wherein 0.15N TMAH aqueous solution was applied to the resist for 60 seconds. FIG. 10 is a cross-sectional view of the resist pattern formed by the second conventional method wherein 0.27N TMAH aqueous solution was applied to the resist for five seconds. FIG. 11 is a cross-sectional view of the resist pattern formed by the method described with reference to FIGS. 5A to 5C.

As FIG. 9 shows, the top region of the resist was left, in part, not dissolved in the first conventional method. As seen from FIG. 10, the resist pattern made in the second conventional method had lines less broad than desired and had its thickness reduced unnecessarily, though 0.27N TMAH aqueous solution was applied to the resist for only five seconds.

The inventors hereof conducted an experiment, in which 0.27N TMAH aqueous solution was applied to a resist for only one second. In this case, no slits or openings were made in the resist. In other words, a resist pattern could not be formed. In view of this, the experimental method can not be practical.

By contrast, the resist pattern formed in the method of FIGS. 5A to 5C had no top regions left not dissolved and had lines having the desired width, as can be understood from FIG. 11. That is, the method could form a desirable resist pattern was formed. This is because the resist 4 was first exposed to the vapor 6 of strong alkali and then subjected to weak development.

In the first embodiment of the invention, a high-concentration TMAH solution is applied to, and maintained on, the surface of the resist, and a low-concentration TMAH solution is applied thereto, thereby developing the resist. As may be understood from the results shown in FIG. 11, the top region of the resist, which is hardly dissolved, can be dissolved under good control. Further, since the resist has a high γ value, thanks to the use of the two types of developing solutions, the resist pattern can have a large exposure dose margin and a large focusing margin and can yet have slits having a rectangular cross section.

(Second Embodiment)

The second embodiment is a method of forming a resist pattern, which uses chemical amplification resist that differs from the one used in the first embodiment. The second embodiment will be described below, with reference to FIGS. 5A to 5C, too. Since the second embodiment is similar to the first embodiment, the steps identical to those of the first embodiment will not be described in detail.

As shown in FIG. 5A, an $SiO_2$ film 2 was formed 500 nm thick on a silicon wafer 1. Thereafter, an anti-reflection film 3 of organic material AR3 (manufactured by Shipley, Inc.) was spin-coated on the $SiO_2$ film 2 to a thickness of 60 nm by the coating-developing apparatus ACT8 (Tokyo Electron Limited). The silicon wafer 1 coated with the anti-reflection film 3 was baked at 190° C. for 90 seconds. Then, a chemical amplification positive resist 4 made of KRF M20G (JSR Co., Ltd.) was formed on the antireflection film 3 to a thickness of 400 nm by means of spin coating. The silicon wafer 1, now having the resist 4, was backed at 140° C. for 60 seconds.

Next, light was applied to the resist 4 through a photomask of a desired pattern by means of the exposure apparatus NSR-S202A (Nikon Corporation). A latent pattern was thereby printed on the resist 4. The resist 4 was exposed to light at NA of 0.6 and α of 0.75, and the photomask was a chromium mask. The silicon wafer 1 having the chemical amplification resist 4 thus exposed to light was baked at 140° C. for 90 seconds. As a result, the structure shown in FIG. 5A was obtained.

Then, the silicon wafer 1 was treated with a 25% aqueous solution of TMAH, instead of an HMDS solution, at 60° C. for one minute, by using the adhesion unit incorporated in the coating-developing apparatus ACT8. To be more specific, the resist 4 was exposed to the vapor 6 of the TMAH aqueous solution. Strong development was thereby performed on only the surface of the resist 4, as is shown in FIG. 5B. The TMAH was therefore applied to the surface of the chemical amplification resist 4. Thereafter, the resist 4 was developed with 0.21N TMAH aqueous solution for 60 seconds. Weak development is thereby effected, dissolving the resist 4 in part. As a result, an L&S pattern having a line width of 0.15 μm was formed as is shown in FIG. 5C.

This L&S pattern was examined under the SEM for the line width of the pattern. More precisely, the widths of the lines were measured, for those parts of the pattern where the exposure dose and the focusing had changed. Two L&S patterns were prepared by two conventional methods, respectively, for comparison with the 0.15 μm L&S pattern formed by the method that is the second embodiment of the invention. In the first conventional method, the resist was developed for 60 seconds with 0.21N TMAH aqueous solution only. In the second conventional method, the resist was developed for five seconds with 0.33N TMAH aqueous solution only. No other developing solution was applied in either conventional method. The L&S pattern formed by the second embodiment had a larger exposure dose margin and a larger focusing margin than the L&S patterns formed by the conventional methods. In addition, it was superior to the L&S patterns made by the conventional methods in terms of the shape of slits.

Thus, the second embodiment achieved the same advantages as the first embodiment, though the chemical amplification resist used differs from the one used in the first embodiment.

(Third Embodiment)

The third embodiment is a method of forming a resist pattern, which is different from the first and second embodiments in respect of the development process only. The third embodiment will be described below, with reference to FIGS. 5A to 5C, too. The steps identical to those of the first and second embodiment will not be described in detail.

As shown in FIG. 5A, an $SiO_2$ film 2 was formed 500 nm thick on a silicon wafer 1. Thereafter, an anti-reflection film 3 of organic material AR3 (Shipley, Inc.) was spin-coated on the $SiO_2$ film 2 to a thickness of 60 nm by the coating-developing apparatus ACT8 (Tokyo Electron Limited). The silicon wafer 1 coated with the anti-reflection film 3 was heated and dried at 190° C. for 90 seconds. Then, a chemical amplification positive resist 4 made of KRF M20G (JSR Co., Ltd.) was formed on the anti-reflection film 3 to a thickness of 40 nm by means of spin coating. The silicon wafer 1, now having the resist 4, was heated and dried at 140° C. for 60 seconds.

Next, light was applied to the resist 4 through a chromium photomask at NA of 0.6 and σ of 0.75, by means of the exposure apparatus NSR-S202A (Nikon Corporation). A latent pattern was thereby printed on the resist 4. The silicon wafer 1 having the chemical amplification resist 4 thus exposed to light was heated at 140° C. for 90 seconds. As a result, the structure shown in FIG. 5A was obtained.

Nitrogen gas was then introduced into a container, forming bubbles in diisopropylamine contained in the container and generating vapor 6 of diisoproplyamine. The vapor 6 was supplied from the container through a tube and applied onto the wafer 1 for two minutes, as is illustrated in FIG. 5B. The vapor 6 worked as a strong alkali to the chemical amplification resist 4. Thereafter, the resist 4 was developed with 0.21N TMAH aqueous solution for 60 seconds. Weak development was thereby effected on the entire resist 4. The resist 4 was dissolved in part, forming an L&L pattern having a line with of 0.15 μm as is illustrated in FIG. 5C.

The 0.15 μm L&S pattern, thus formed on the entire wafer 1, was examined under the SEM for the line width of the pattern. The line width of the pattern was measured through the SEM, for those parts of the pattern where the exposure dose and the focusing had changed. The widths of the lines differed from the design value by 8 nm at most, at 3σ.

Two L&S patterns were prepared by two conventional methods, respectively, for comparison with the 0.15 PA L&S pattern formed by the method that is the third embodiment of the invention. In the first conventional method, the resist was developed for two seconds with 0.33N TMAH aqueous solution only. In the second conventional method, the resist was developed for 40 seconds with 0.12N TMAH aqueous solution only. No other developing solution was applied in either conventional method. The L&S patterns formed by the conventional methods had line widths, which differed from the design value by 25 nm at most, at 3σ.

The L&S pattern formed by the third embodiment had line width far less different from the design value than did the line width of the L&S patterns made by the conventional methods.

(Fourth Embodiment)

The fourth embodiment is a modification of the first to third embodiments. This embodiment is different in that strong alkaline is applied to the surface of the resist by means of coating, not by applying vapor of strong alkali to the surface of the resist as in the first to third embodiments. The fourth embodiment will be described below, with reference to FIGS. 5A to 5C, too. The steps identical to those of the first to third embodiments will not be described in detail.

As shown in FIG. 5A, an $SiO_2$ film 2 was formed 500 nm thick on a silicon wafer 1. Thereafter, an anti-reflection film 3 of organic material AR5 (Shipley, Inc.) was spin-coated on the $SiO_2$ film 2 to a thickness of 95 nm by the coating-developing apparatus ACT8 (Tokyo Electron Limited). The silicon wafer 1 coated with the anti-reflection film 3 was heated and dried at 190° C. for 90 seconds. Then, a chemical amplification positive resist 4 made of KRF M20G (JSR Co., Ltd.) was formed on the anti-reflection film 3 to a thickness of 40 nm by means of spin coating. The silicon wafer 1, now having the resist 4, was heated and dried at 140° C. for 60 seconds.

Next, light was applied to the resist 4 through a chromium photomask at NA of 0.6 and a of 0.75, by means of the exposure apparatus NSR-S202A (Nikon Corporation). A latent pattern was thereby printed on the resist 4. The silicon wafer 1 having the chemical amplification resist 4 thus exposed to light was heated at 140° C. for 90 seconds. As a result, the structure shown in FIG. 5A was obtained.

Then, solution prepared by dispersing potassium ethoxide in anisole was applied to the surface of the resist 4 by spin coating. Residual potassium ethoxide was removed from the surface of the resist 4 by rinsing the resist 4 with spray of anisole for five seconds. The solution containing potassium ethoxide worked as strong alkali. Thereafter, the resist 4 was developed with 0.21N TMAH aqueous solution for 60 seconds. As a result, the resist 4 was dissolved in part, forming an L&S pattern having a line width of 0.15 μm is shown in FIG. 5C.

The 0.15 μm L&S pattern, thus formed on the entire wafer 1, was examined under the SEM for the line width of the pattern. The line width of the pattern was measured through the SEM, for those parts of the pattern where the exposure dose and the focusing had changed. The widths of the lines differed from the design value by 8 nm at most, at 3σ.

The fourth embodiment achieved the same advantages as the first to third embodiments, though the strong alkali had been applied to the resist by means of coating.

The strong alkali was applied to the resist by spin-coating in the fourth embodiment. Nonetheless, the strong alkali may be dripped onto the resist and then spread over the resist with a tool such as a brush.

The present invention is not limited to the first to fourth embodiments described above. In the above embodiments, the strong development was performed by applying a TMAH aqueous solution or a potassium othoxide solution to the surface of the resist. Instead, any other strong alkali, such as triethanolamine, may be used to obtain the same advantages as mentioned above. In the above embodiments, vapor of strong alkali was applied to, or strong alkali was spin-coated on, the resist to develop the resist. Instead, a strong alkali solution may be sprayed onto the surface of the resist. Further, the chemical amplification resist may be replaced by novolak-based resist. Still further, the resist is not limited to a positive one. A negative resist can be used instead, in the present invention.

Moreover, the strong alkali may be one that is gas, liquid or solid at normal temperature and normal pressure. If it is gas, it will be directly applied onto the surface of the resist. If it is liquid, temperature-controlled nitrogen gas will be introduced into it, forming bubbles in it and generating vapor, and the vapor will be applied to the resist. If it is solid, it will be heated, generating vapor, and the vapor will be applied to the resist. The liquid or solid alkali may be solved in a solvent that hardly dissolves the resist, and the resultant solution may be sprayed onto the resist.

Substances that may be used as strong alkali in the present invention will be described below.

The solid strong alkalis that may be used in the invention are: inorganic alkalis such as potassium hydroxide, sodium hydroxide, potassium ethoxide, sodium ethoxide, and the like; aliphatic amine compounds (i.e., organic alkalis) such as diethanolamine, diisopropanolamine, triisopropanolamine, triethylendiamine, and the like; anilines (organic alkalis) such as p-anisidine, p-aminoacetanilide, paminophenol, 2-amino-4-chrolophenol, 4-amino-2-chrolophenol, m-aminophenol, aminobenzenzaldehyde, and the like; pyridine derivatives (i.e., organic alkalis) such as 4-phenylpyridine and the like; and quaternary ammonium salts (i.e., organic alkalis) such as tetramethyl-ammonium hydroixde (TMAH), hydroxyethyltrimethyl-ammonium hydroxide (choline), tetraethylammonium hydroxide, and the like.

The liquid strong alkalis that may be used in the invention are: aliphatic amine compunts (i.e., organic alkalis) such as ethylamine, diethylamine, triethyamine, isopropylamine, diisopropylamine, propylamine, dipropylamine, tripropylamine, butylamine, dibutylamine, tributylamine, isobutylamine, diisopropylamine, s-butylamine, di-s-butylamine, 1,2-diaminopropane, 1,3-diaminopropane, t-butylamine, allylamine, diallylamine, triallylamine, 2-ethyl-1-hexylamine, bis(2-ethyl-1-hexyl) amine, tri(2-ethyl-1-hexyl) amine, ethanolamine, triethanolamine, isopropanolamine, ethylenediamine, diethylentriamine, triethylenetetramine, tetraethylene-pentamine, pentaethylenehexamine, and the like; anilines (i.e., organic alkalis) such as aniline, o-anisidine, Nethylaniline, and the like; and pyridine derivatives (i.e., organic alkalis) such as pyridine, 2-picoline, 3-picoline, 4-picoline, 2-phenylpyridine, 3-phenylpyridine, and the like.

The gaseous strong alkalis that may be used in the invention are: aliphatic amine compounds (i.e., organic alkalis) such as methylamine, dimethylamine, trimethylamine, and the like.

As has been described above, the resist is developed in two steps, strong developing step and weak developing steps, in the method of forming a resist pattern according to the present invention. In the strong developing step, strong alkali is applied to the surface of the resist. The unit for performing the strong development can therefore be replaced by the unit for applying the weak development within a short time. Hence, the method can form a resist pattern which has a large exposure dose margin and a large focusing margin and which can yet have slits having a rectangular cross section.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a resist pattern, comprising the steps of:

exposing a resist formed on a substrate, to light;

applying a strong alkali substance to a surface of the resist, which has been exposed to light; and developing the entire resist by applying a developing solution that is less alkaline than the strong alkali substance.

2. A method according to claim 1, wherein the step of applying the strong alkali substance to the surface of the resist is to expose the resist to vapor of strong alkali.

3. A method according to claim 1, wherein the step of applying the strong alkali substance to the surface of the resist is to coat the resist with a solution of strong alkali.

4. A method according to claim 1, wherein the step of applying the strong alkali substance to the surface of the resist is to spray a strong alkali solution onto the surface of the resist.

5. A method according to claim 1, wherein the resist is a chemical amplification positive resist.

6. A method according to claim 1, wherein the resist is a chemical amplification positive resist, and the developing solution is one that does not dissolve those parts of the surface of the resist which have not been exposed to light.

7. A method according to claim 1, wherein the resist is a chemical amplification negative resist.

8. A method according to claim 1, wherein the resist is a chemical amplification negative resist, and the developing solution is one that does not dissolve those parts of the surface of the resist which have not been exposed to light.

9. A method according to claim 1, wherein the strong alkali substance is one selected from the group consisting of inorganic alkali, organic alkali, anilines and pyridine derivatives.

10. A method of forming a resist pattern, comprising the steps of:

forming an $SiO_2$ film on a silicon substrate;

forming an anti-reflection film on the $SiO_2$ film;

forming a chemical amplification positive resist on the anti-reflection film;

exposing the chemical amplification positive resist to vapor containing a strong alkali substance, thereby applying the strong alkali substance to a surface of the chemical amplification positive resist; and developing the entire resist with a developing solution that is less alkaline than the strong alkali substance.

11. A method according to claim 10, wherein the strong alkali substance is tetramethylammonium hydroxide (TMAH).

12. A method according to claim 10, wherein the developing solution that is less alkaline than the strong alkali is an aqueous solution of tetramethylammonium hydroxide (TMAH).

13. A method according to claim 10, wherein the strong alkali substance is vapor of disiopropylamine.

14. A method according to claim 10, wherein the strong alkali substance is potassium ethoxide.

* * * * *